United States Patent
Taniguchi et al.

(10) Patent No.: US 7,345,402 B2
(45) Date of Patent: Mar. 18, 2008

(54) PIEZOELECTRIC THIN-FILM RESONATOR AND FILTER USING THE SAME

(75) Inventors: Shinji Taniguchi, Kawasaki (JP); Tsuyoshi Yokoyama, Kawasaki (JP); Takeshi Sakashita, Kawasaki (JP); Jun Tsutsumi, Kawasaki (JP); Masafumi Iwaki, Kawasaki (JP); Tokihiro Nishihara, Kawasaki (JP); Masanori Ueda, Yokohama (JP)

(73) Assignees: Fujitsu-Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/326,418

(22) Filed: Jan. 6, 2006

(65) Prior Publication Data

US 2006/0152110 A1 Jul. 13, 2006

(30) Foreign Application Priority Data

Jan. 12, 2005 (JP) .............................. 2005-005791

(51) Int. Cl.
 *H03H 9/15* (2006.01)
 *H01L 41/04* (2006.01)
(52) U.S. Cl. ...................... 310/320; 310/324; 310/369; 333/187; 333/189
(58) Field of Classification Search ................ 310/320, 310/321, 324, 365, 369; 333/186, 187, 189
 See application file for complete search history.

(56) References Cited

U.S. PATENT DOCUMENTS

| | | | | |
|---|---|---|---|---|
| 4,642,508 A | | 2/1987 | Suzuki et al. | |
| 4,720,651 A | * | 1/1988 | Nakazawa et al. | 310/369 |
| 5,185,589 A | * | 2/1993 | Krishnaswamy et al. | 333/133 |
| 6,150,703 A | * | 11/2000 | Cushman et al. | 257/415 |
| 6,346,762 B2 | * | 2/2002 | Watanabe et al. | 310/328 |
| 6,448,699 B1 | * | 9/2002 | Scepanovic et al. | 310/365 |
| 6,556,103 B2 | * | 4/2003 | Shibata et al. | 333/187 |
| 7,042,137 B2 | * | 5/2006 | Yoon | 310/324 |
| 7,183,694 B2 | * | 2/2007 | Nanataki et al. | 310/324 |
| 2002/0030419 A1 | * | 3/2002 | Suzuki et al. | 310/320 |
| 2002/0130593 A1 | * | 9/2002 | Lee et al. | 310/365 |

(Continued)

FOREIGN PATENT DOCUMENTS

JP 57-80898 * 5/1982

(Continued)

OTHER PUBLICATIONS

"ZnO/SiO$_2$-Diaphragm Composite Resonator on a Silicon Wafer" Electronic Letters, Jul. 9, 1981, vol. 17, No. 14, pp. 507-509.

(Continued)

*Primary Examiner*—Thomas M. Dougherty
(74) *Attorney, Agent, or Firm*—Arent Fox LLP (57) ABSTRACT

A piezoelectric thin-film resonator includes a film laminate formed on a device substrate, the film laminate including a lower electrode, a piezoelectric film provided on the device substrate and the lower electrode, and an upper electrode provided on the piezoelectric film. At least one of the upper and lower electrodes has an electrode leading portion that extends from an membrane in which the upper electrode overlaps with the lower electrode through the piezoelectric film and has a width narrower than that of the membrane.

10 Claims, 7 Drawing Sheets

U.S. PATENT DOCUMENTS

| | | | |
|---|---|---|---|
| 2004/0174092 A1* | 9/2004 | Iwata | 310/324 |
| 2004/0183399 A1* | 9/2004 | Nakatani et al. | 310/320 |
| 2004/0245892 A1* | 12/2004 | Yamada et al. | 310/320 |
| 2005/0110369 A1* | 5/2005 | Onishi et al. | 310/320 |
| 2005/0218757 A1* | 10/2005 | Yamaguchi et al. | 310/365 |
| 2005/0269904 A1* | 12/2005 | Oka | 310/324 |
| 2007/0152540 A1* | 7/2007 | Fujii et al. | 310/324 |

FOREIGN PATENT DOCUMENTS

| | | | |
|---|---|---|---|
| JP | 60-189307 A | | 9/1985 |
| JP | 62-76913 A | | 4/1987 |
| JP | 62-200813 | * | 9/1987 |
| JP | 63-187714 A | | 8/1998 |
| JP | 2000-69594 A | | 3/2000 |
| JP | 2002-314368 A | | 10/2002 |
| JP | 2003-204239 A | | 7/2003 |
| JP | 2003-273693 A | | 9/2003 |
| JP | 2004-032572 A | * | 1/2004 |
| JP | 2006-197147 | * | 7/2006 |

OTHER PUBLICATIONS

David Feld, Kun Wang, Paul Bradley, A High Performance 3.0 mm×3.0 mm×1.1 mm FBAR Full Band Tx Filter for U.S. PCS Handsets, S.M., IEEE, Andrew Barfknecht, Ba Ly, Richard Ruby Wireless Semiconductor Division, Agilent Technologies, Inc., Newark, CA., 94560, U.S.A., no date provided.

* cited by examiner

PIEZOELECTRIC THIN-FILM RESONATOR AND FILTER USING THE SAME

BACKGROUND OF THE INVENTION

1. Field of the Invention

The present invention generally relates to a piezoelectric thin-film resonator that utilizes the conversion between an electrical signal and a bulk acoustic wave, and more particularly, to a filter using the piezoelectric thin-film resonator.

2. Description of the Related Art

As wireless communication devices such as mobile-phone handsets have widely spread, there is an increasing demand for compact and light resonators and filters having these resonators. Conventionally, dielectric filters and surface acoustic wave (SAW) filters are mainly used. Recently, attention has been drawn to piezoelectric thin-film resonators and filters using these resonators. The piezoelectric thin-film resonators have good high-frequency characteristics and are capable of realizing compact and monolithic devices.

A film bulk acoustic resonator (FBAR) is known as one of the piezoelectric thin-film resonators. The FBAR has a device substrate on which a laminate structure (composed of multiple films). The laminate structure has, as essential structural elements, an upper electrode, a piezoelectric film, and a lower electrode. An opening (via hole or cavity) is formed below the lower electrode and is located below a region in which the upper electrode and the lower electrode face overlap with each other. The opening may be formed by etching (wet etching or dry etching) from the backside of a silicon substrate used as the device substrate, or by wet etching a sacrificed layer on the silicon substrate.

A high-frequency signal is applied between the upper electrode and the lower electrode, an acoustic wave is generated within the piezoelectric film sandwiched between the upper and lower electrodes. The acoustic wave thus generated is excited by the reverse piezoelectric effect and distortion arising from the piezoelectric effect. The acoustic wave is totally reflected by the surface of the upper electrode (film) that is in contact with air and the surface of the lower electrode (film) that is in contact with air. Thus, the acoustic wave is a thickness-extensional wave having main displacements in the thickness direction. In the present device structure, a resonance takes place at a frequency at which the total thickness H of the thin-film laminate structure composed of the upper electrode/piezoelectric film/lower electrode located above the opening is equal to an integer multiple of the ½ wavelength of the acoustic wave. The propagation velocity V of the acoustic wave is determined by the material used, and the resonant frequency F is written as $F=nV/2H$. By utilizing the resonant phenomenon, it is possible to control the resonant frequency with the thickness being used as a parameter for control and to realize the resonators and filters having desired frequency responses.

The upper and lower electrodes may be a film laminate made of a metal such as aluminum (Al), copper (Cu), molybdenum (Mo), tungsten (W), tantalum (Ta), platinum (Pt), ruthenium (Ru), rhodium (Rh), iridium (Ir), chromium (Cr), or titanium (Ti), or an arbitrary combination of these metals. The piezoelectric film may be aluminum nitride (AlN), zinc oxide (ZnO), lead zirconium titanate (PZT), or lead titanate (PbTiO$_3$). Preferably, the piezoelectric film is aluminum nitride or zinc oxide having the main axis in the (002) direction. The device substrate may be made of silicon, glass or gallium arsenide (GaAs).

As described above, the piezoelectric thin-film resonator having the above-mentioned structure is required to have a via hole or cavity just below the lower electrode (or a dielectric film). In the following description, the via hole is defined as a hole that penetrates the device substrate and connect the upper and lower surfaces thereof, and the cavity is defined as a hole provided in the vicinity of the surface or just below the lower electrode.

Figure 1:
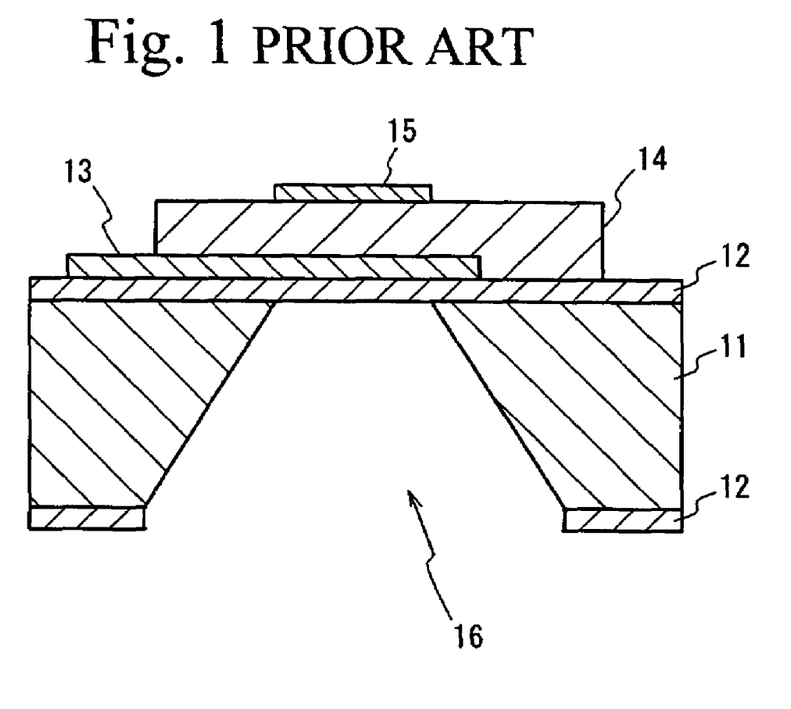
FIG. 1 is a cross-sectional view of a conventional piezoelectric thin-film resonator described in Document 1.

FIG. 1 is a cross-sectional view of a conventional piezoelectric thin-film resonator described in Electron. Lett., 1981, vol. 17, pp 507-509 (hereinafter referred to as Document 1). A laminate structure is provided on a (100) silicon substrate 11 having a thermal oxide film (SiO$_2$), and is composed of a lower electrode 13 that is an Au—Cr film, a piezoelectric film 14 that is a ZnO film, and an upper electrode 15 that is an aluminum film. A via hole 16 is formed below the film laminate. The via hole 16 may be formed by anisotropic etching using KOH or EDP (ethylenediamine and pyrocatechol) from the backside of the (100) silicon substrate 11.

Figure 2:
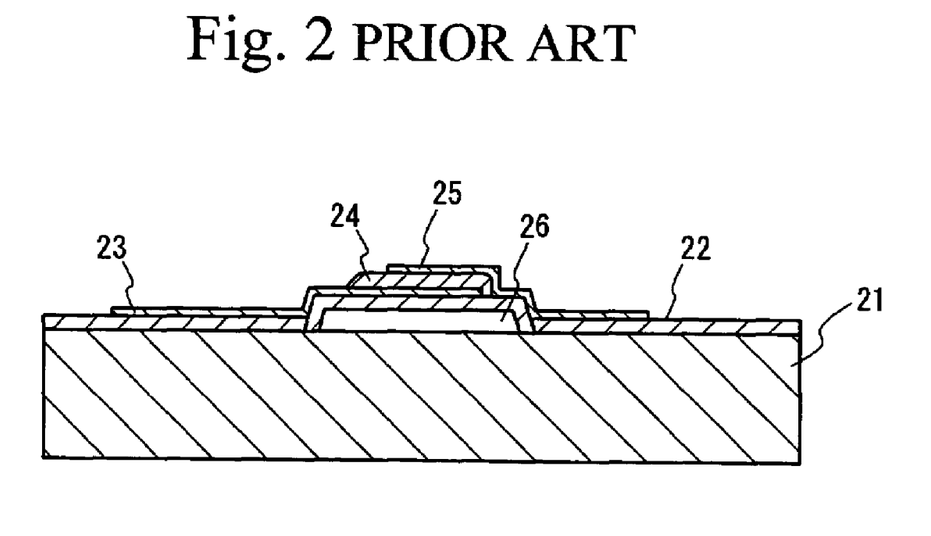
FIG. 2 is a cross-sectional view of another conventional piezoelectric thin-film resonator of a cavity type described in Document 2.

In contrast, the piezoelectric thin-film resonator of the cavity type has, on a sacrificed layer, a laminate structure composed of an upper electrode, a piezoelectric film and a lower electrode (dielectric film as necessary). The sacrificed layer is removed by etching, so that the cavity can be defined. FIG. 2 is a cross-sectional view of a conventional piezoelectric thin-film resonator of the cavity type disclosed in Japanese Patent Application Publication No. 60-189307 (Document 2). A film laminate is composed of a lower electrode 23, a piezoelectric film 24 and an upper electrode 25 provided on a device substrate 21 having a thermal oxide film (SiO$_2$) 22. A cavity 26 is defined below the film laminate. The cavity 26 may be formed by patterning an island-like sacrificed layer of ZnO, forming the film laminate on the sacrificed layer, and removing the sacrificed layer located below the film laminate by acid.

Figure 3:
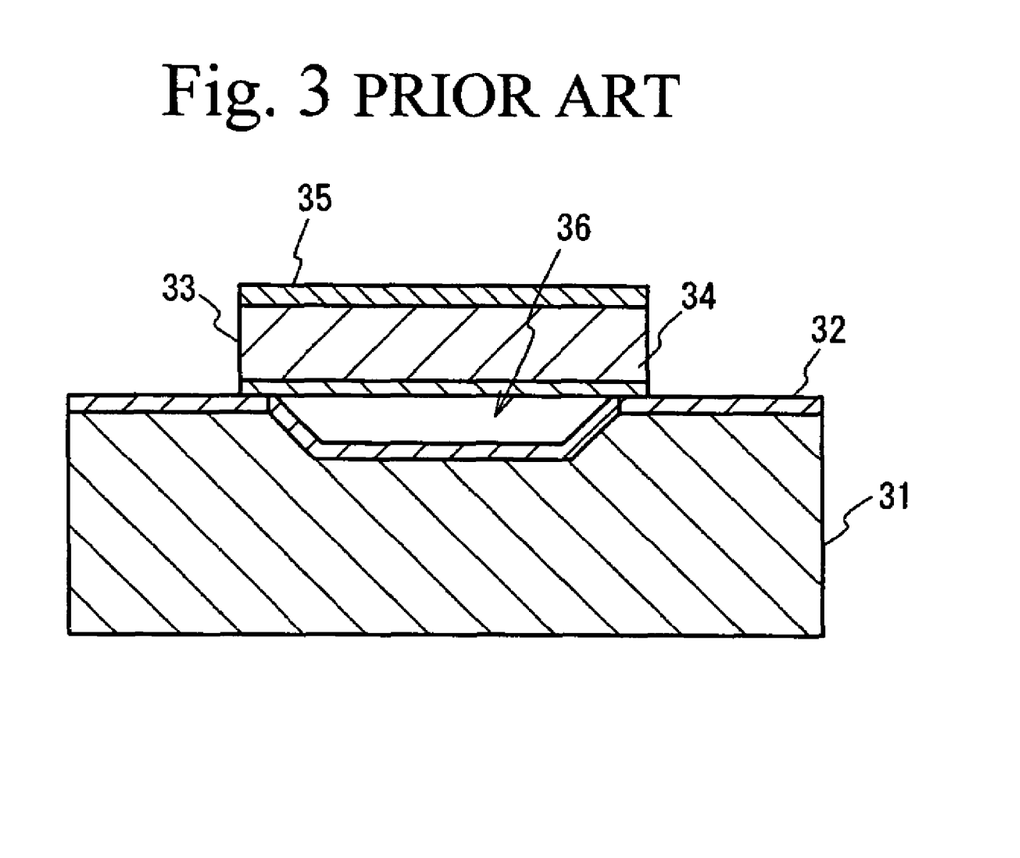
FIG. 3 is a cross-sectional view of yet another conventional cavity type piezoelectric thin-film resonator described in Document 3.

Japanese Patent Application Publication No. 2000-69594 (Document 3) shows another type of piezoelectric thin-film resonator, which is illustrated in FIG. 3. A film laminate composed of a lower electrode 33, a piezoelectric film 34 and an upper electrode 35 is provided on a silicon substrate 31 having a thermal oxide film (SiO$_2$) 32. A cavity 36 is formed below the film laminate. This piezoelectric thin-film resonator may be fabricated as follows. A recess is formed in a part of the surface of the silicon substrate 31 by etching. Next, the thermal oxide film (SiO$_2$) 32 is formed on the silicon substrate 31 in order to prevent phosphorus of PSG (PhosphoSilicate Glass) used as the sacrificed layer. Then, the sacrificed layer is deposited and is grinded and cleaned. Thereafter, the surface of the sacrificed layer is processed so as to have a mirror surface. Subsequently, the lower electrode 33, the piezoelectric film 34 and the upper electrode 35 are grown in this order. Finally, the PSG film is removed.

In the above-mentioned piezoelectric thin-film resonators, attention is usually drawn to the resonator structure in the thickness direction of the device substrate, namely, the membrane structure having the piezoelectric film sandwiched between the upper and lower electrodes, and the reflection structure for the acoustic wave by the lower electrode, namely, the structure of the lower electrode. That is, the electrode shape other than the membrane structure is not specifically considered.

SUMMARY OF THE INVENTION

The present invention has been made in view of the above circumstances and has an object of improving the resonator performance, particularly, insertion loss by giving specific considerations to electrode portions connected to a membrane of the piezoelectric thin-film resonator.

According to an aspect of the present invention, there is provided a piezoelectric thin-film resonator including: a film laminate formed on a device substrate, the film laminate including a lower electrode, a piezoelectric film provided on the device substrate and the lower electrode, and an upper electrode provided on the piezoelectric film, at least one of the upper and lower electrodes having an electrode leading portion that extends from an membrane in which the upper electrode overlaps with the lower electrode through the piezoelectric film and has a width narrower than that of the membrane.

According to another aspect of the present invention, there is provided a filter including: resonators that connected to form a filter and have a device substrate, each of the resonators including: a film laminate formed on the device substrate, the film laminate including a lower electrode, a piezoelectric film provided on the device substrate and the lower electrode, and an upper electrode provided on the piezoelectric film, at least one of the upper and lower electrodes having an electrode leading portion that extends from an membrane in which the upper electrode overlaps with the lower electrode through the piezoelectric film and has a width narrower than that of the membrane.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 4A:
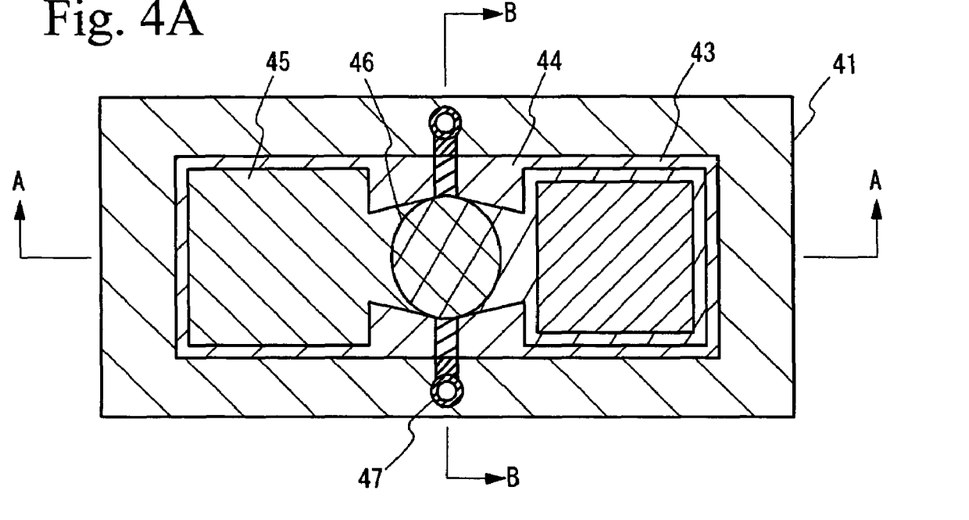
FIG. 4A is a plan view of a piezoelectric thin-film resonator according to an embodiment of the present invention.
Figure 4B:
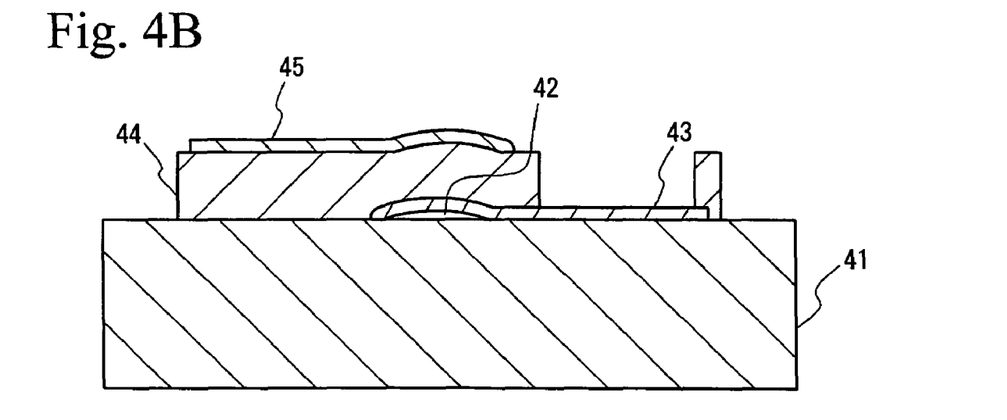
FIG. 4B is a cross-sectional view taken along a line A-A shown in FIG. 4A.
Figure 4C:
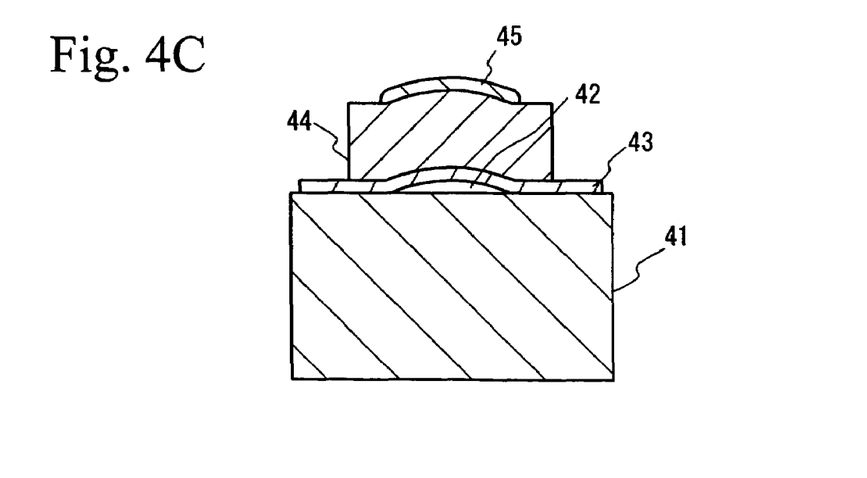
FIG. 4C is a cross-sectional view taken along a line B-B shown in FIG. 4A.

FIGS. 4A through 4C illustrate a piezoelectric thin-film resonator according to an embodiment of the present invention. More particularly, FIG. 4A is a plan view of the resonator, FIG. 4B is a cross-sectional view taken along a line A-A shown in FIG. 4A, and FIG. 4C is a cross-sectional view taken along a line B-B shown in FIG. 4A. Referring to these figures, a device substrate 41 may be a (100) silicon substrate, on which a lower electrode 43 is formed. The lower electrode 43 may be a Ru layer. A quartz substrate may be used instead of the silicon substrate. A piezoelectric film 44 may be an AlN film, and an upper electrode 45 may be a Ru film. Preferably, the piezoelectric film 44 may be an AlN or ZnO film having the orientation with the (002) main axis.

A membrane 46 (cross-hatched area) is defined so that the upper electrode 45 and the lower electrode 43 face each other through the piezoelectric film 44. A cavity 42 is formed between the portion of the lower electrode 43 located below the membrane 46 and the device substrate 41. The cavity 42 has a raised portion having a dome-like shape. The membrane 46 is curved upwards so as to have an arch shape and define the cavity 42. The cavity 42 has a contour such that the projected shape of the cavity 42 on the device substrate 41 depicts a closed curve. For example, the projected shape may have a polygonal shape or a combination of a closed curve and a polygonal shape. The shape of the membrane 46 and the projected shape of the cavity 42 on the device substrate 41 may have polygonal shapes, each of which has at least one respective pair of sides that are no in parallel. In the present embodiment, the membrane 46 in which the upper electrode overlaps with the lower electrode 43 has an oval shape, and the contour of the cavity 42 has a size almost equal to that of the membrane 46. The cavity 42 may be formed by removing the sacrificed layer patterned below the lower electrode 43. The device substrate 41 has etchant introducing holes 47 through which an etchant is supplied to etch and remove the sacrificed layer (the holes 47 are omitted in FIG. 4C).

Each of the upper electrode 45 and the lower electrode 43 has a electrode leading portion used to input or output an electrical signal and connected to the membrane 46. The electrode leading portion of at least one of the upper electrode 45 and the lower electrode 43 has a width narrower than the width of the membrane 46. In the embodiment shown in FIGS. 4A through 4C, both the upper electrode 45 and the lower electrode 43 have the above connecting points. That is, each of the upper electrode 45 and the lower electrode 43 has the electrode leading portion used to input or output an electrical signal and connected to the membrane 46, the electrode leading portion having a width narrower than the width of the membrane 46 (which corresponds to the length of the longitudinal axis of the oval membrane 46). In a structure shown in FIG. 7A described later, only the lower electrode 43 has a electrode leading portion that is used to input or output an electrical signal and is connected to the membrane 46 so that the electrode leading portion has a width narrower than the width of the membrane 46. The resonator is defined by the membrane 46 and the electrode leading portions of the upper and lower electrodes 45 and 43. The electrode leading portion of the lower electrode 43 is fixed to and held by the device substrate 41, and the electrode leading portion of the upper electrode 45 is fixed to and held by the piezoelectric film 44. Thus, the membrane 46 may not have an even dome shape. However, the present embodiment employs the electrode leading portion narrower than the membrane 46 for at least one of the upper electrode 45 and the lower electrode 43, and therefore has the reduced fixed and held region. This contributes to forming an even dome shape of the membrane 46 having little deformation and to improving the resonator performance.

Figure 5A:
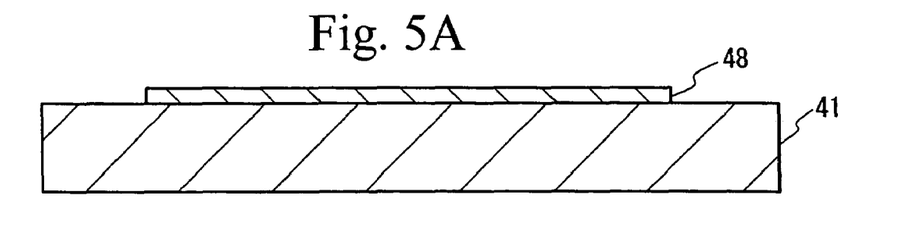
FIGS. 5A through 5D are cross-sectional views showing a method of fabricating the piezoelectric thin-film resonator shown in FIGS. 4A through 4C.

FIGS. 5A through 5D show a process of fabricating the piezoelectric thin-film resonator shown in FIGS. 4A through 4C, and illustrate cross sections taken along the line B-B shown in FIG. 4A. First, a MgO film serving as a sacrificed layer is grown on the silicon substrate 41 (or quartz substrate) by sputtering or vacuum evaporation (FIG. 5A). Instead of MgO, the sacrificed layer 48 may be made of a material that can easily be dissolved, such as Zn, Ge or Ti. Next, the sacrificed layer 48 is patterned into a desired shape by the photolithographic technique and etching.

Figure 6:
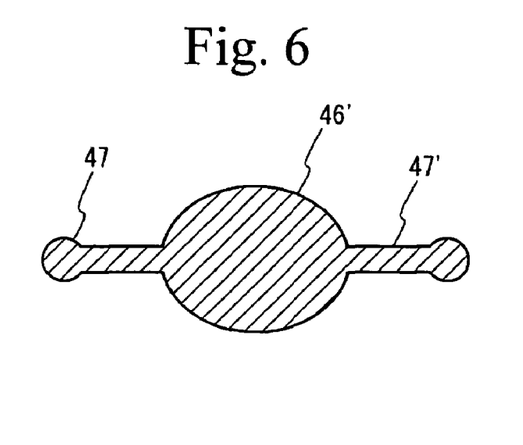
FIG. 6 shows an example of a patterned sacrificed layer.

FIG. 6 shows an example of the patterned sacrificed layer 48, which has a membrane corresponding region 46' and flow passages 47'. The region 46' has the same shape as that of the membrane 46 in which the upper electrode 45 overlaps with the lower electrode 43 through the piezoelectric film 44. The flow passages 47' are connected to the etchant introducing holes 47. That is, the lower electrode 43 has the holes 47 connected to the cavity 42 via the flow passages 47'. The number of flow passages 47' is not limited to two but an arbitrary number of passages 47' may be provided in arbitrary positions. It is not essential that the sacrificed layer 48 has the same pattern size as that of the membrane 46. However, it is desired that the shape of the sacrificed layer 48 is similar to that the overlapping region of the upper electrode 45 and the lower electrode 43, namely, the shape of the membrane 46. That is, the projected shape of the cavity 42 on the device substrate 41 is preferably similar to the projected shape of the membrane 46 thereon.

Figure 5B:
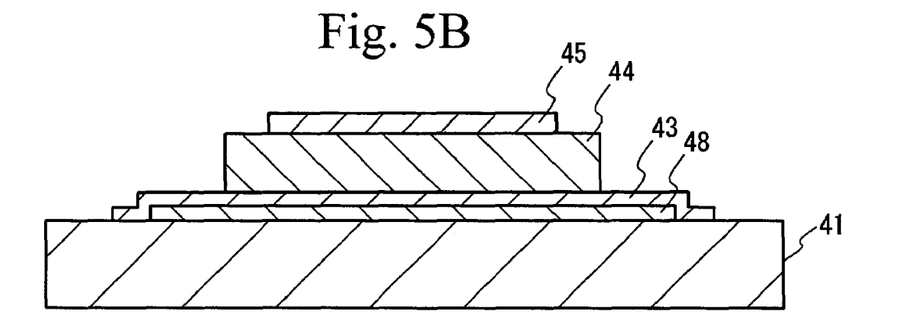

Next, the lower electrode 43, the piezoelectric film 44 and the upper electrode 45 are sequentially formed (FIG. 5B). The lower electrode 43 is grown by sputtering in an Ar gas atmosphere at a pressure of 0.6-1.2 Pa and patterned into a desired shape by the photolithographic technique and etching. Subsequently, an AlN film functioning as the piezoelectric film 44 is grown by sputtering with an Al target in a mixed gas of Ar and $N_2$ at a pressure of approximately 0.3 Pa. Then, an Ru film functioning as the upper electrode 45 is grown by sputtering in an Ar gas atmosphere at a pressure of 0.6-1.2 Pa. Thereafter, a laminate of the upper electrode 45 and the piezoelectric film 44 are patterned into a desired shape by the photolithographic technique and etching (wet or dry etching).

Figure 5C:
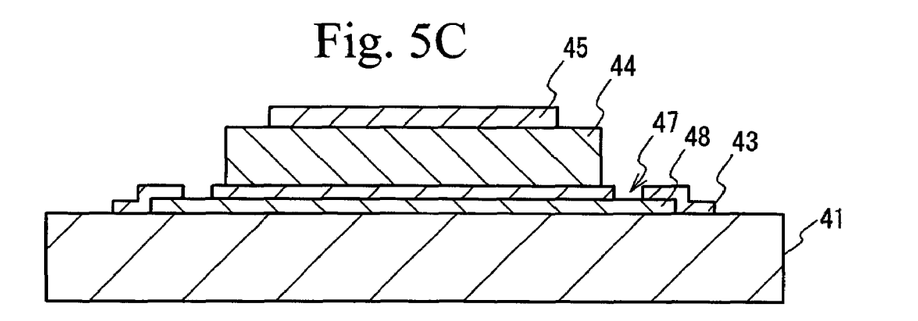
Figure 5D:
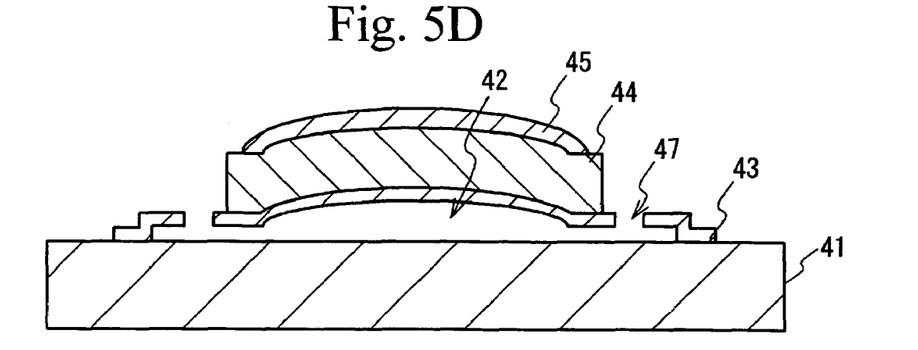

Then, the etchant introducing holes 47 are formed in the lower electrode 43 by the photolithographic technique and etching (wet or dry etching) with a resist pattern (FIG. 5C). Etchant is introduced through the holes 47 to remove the sacrificed layer 48, so that the cavity 42 can be formed (FIG. 5D). The etchant introducing holes 47 may be formed at the same time as the lower electrode 43 is etched. The film laminate (composite films) composed of the lower electrode 43, the piezoelectric film 44 and the upper electrode 45 has compressive stress. With the compressive stress, the film laminate is raised upwards so that the dome-shaped cavity 42 can be formed between the lower electrode 43 and the device substrate 41 when the sacrificed layer 48 is completely etched. The film laminate obtained under the above-mentioned sputtering conditions has compressive stress of about (minus) 300 MPa.

Figure 7A:
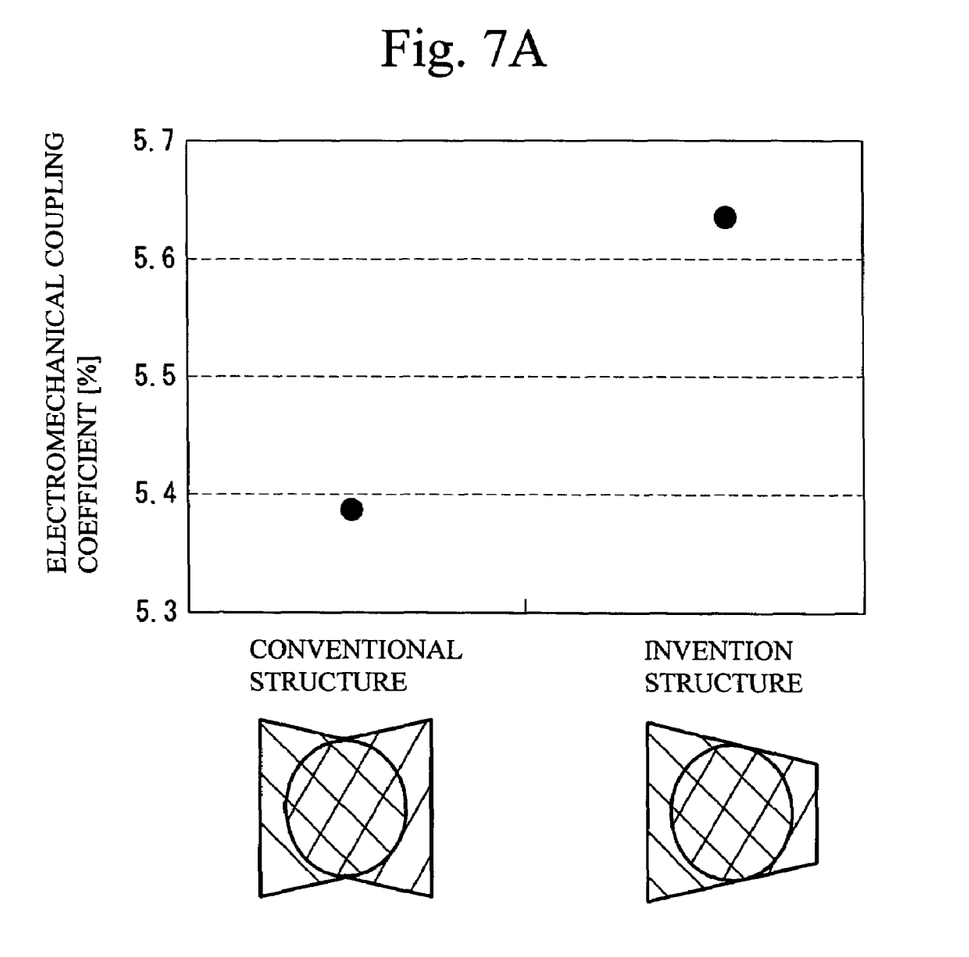
FIG. 7A shows a resonant characteristic of the piezoelectric thin-film resonator in accordance with the first embodiment.
Figure 7B:
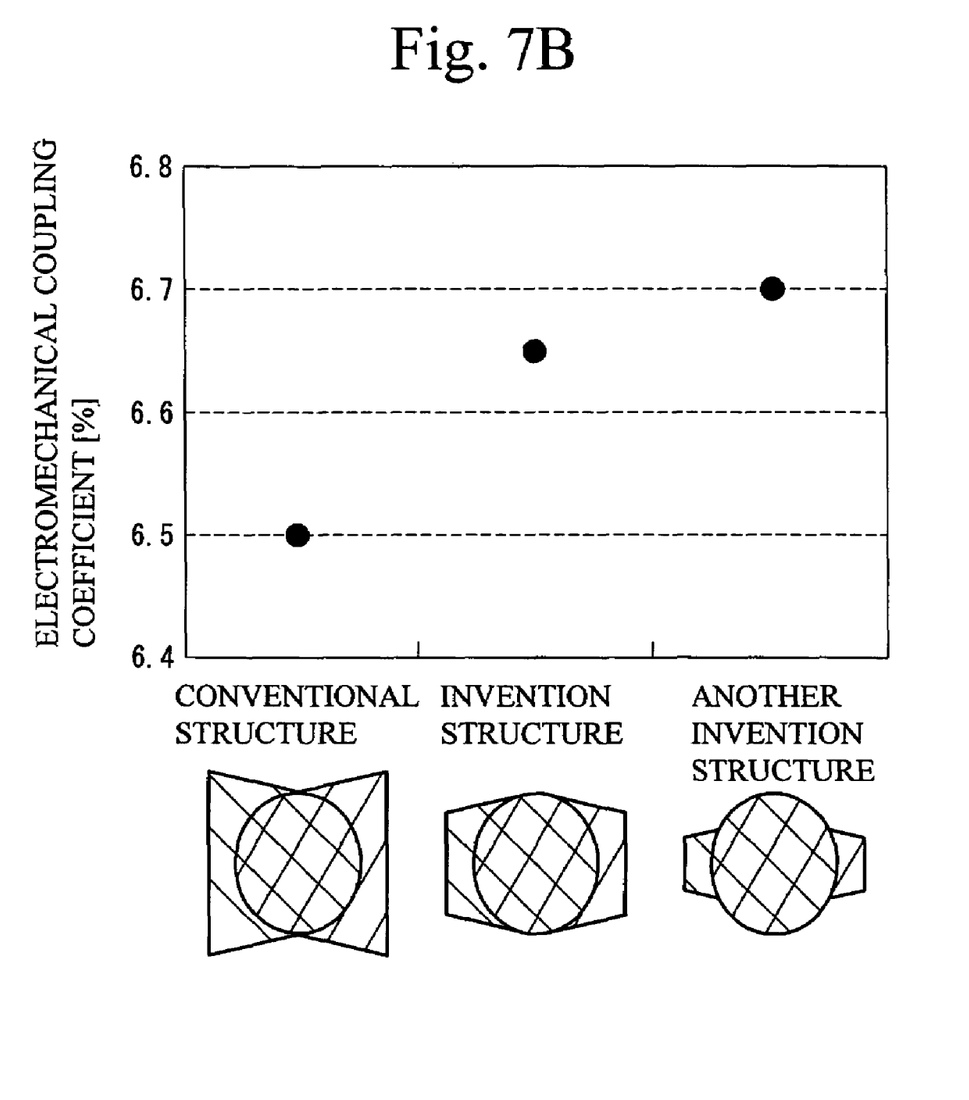
FIG. 7B shows resonant characteristics of piezoelectric thin-film resonators having different electrode leading structures in accordance with the first embodiment.

FIGS. 7A and 7B describe the resonance characteristics of the piezoelectric thin-film resonators fabricated by the above-mentioned process, and specifically describe changes of the electromechanical coefficients [%] observed when the shapes of the upper and lower electrodes in the non-membrane regions are changed. It can be seen from FIGS. 7A and 7B that the resonators configured in accordance with the present invention have improved electromechanical coupling coefficients, as compared to the conventional resonator. The resonators of the present invention shown in FIGS. 7A and 7B have at least one electrode leading portion that extends from the membrane and is narrower than the membrane. In contrast, the conventional resonator shown in FIGS. 7A and 7B has the two electrode leading portions that extend from the membrane and are wider than the membrane. More specifically, the resonator of the present invention shown in FIG. 7A is configured so that the electrode leading portion of only one of the two electrodes has the maximum width equal to the length of the longitudinal axis of the membrane and has a width that gradually (continuously) becomes narrow towards the end thereof. The other electrode has the leading portion having a width gradually (continuously) becoming wider towards the end thereof. The resonator shown on the lower center side of FIG. 7B has the same electrode leading portions as those shown in FIG. 4A. That is, the electrode leading portions of the upper and lower electrodes have the maximum width equal to the length of the longitudinal axis of the membrane and widths that gradually and continuously become narrow towards the ends thereof. The resonator shown on the lower right side of FIG. 7B has lower and upper electrodes having electrode leading portions that have the maximum widths narrower than the length of the longitudinal axis of the membrane and widths that gradually become narrow towards the ends thereof. It is to be noted that the conventional resonators shown in FIGS. 7A and 7B have different electromechanical coupling coefficients because these resonators have different electrode areas although having the same shapes.

Figure 8:
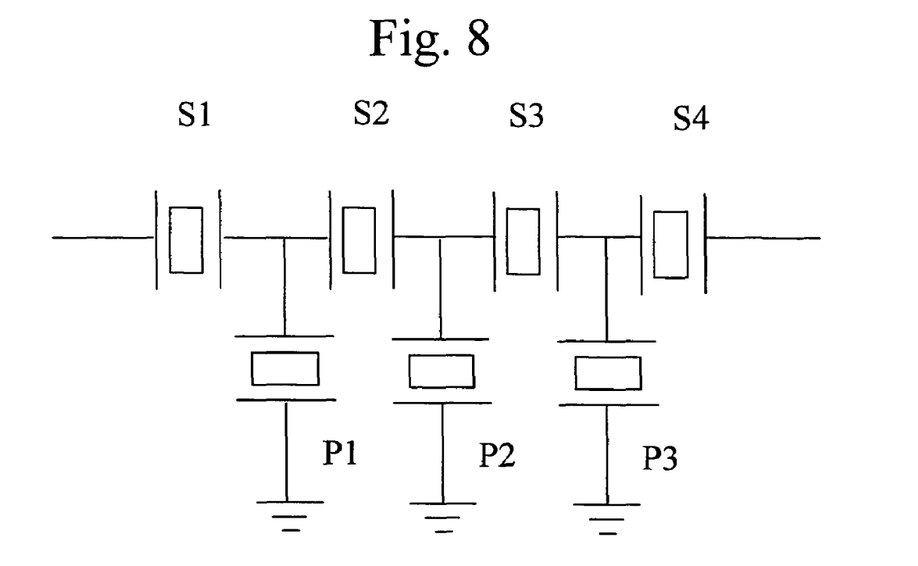
FIG. 8 is a circuit diagram of a filter with piezoelectric thin-film resonators in accordance with a second embodiment.

A description will now be given of a second embodiment of the present invention. FIG. 8 is a bandpass filter in which the resonators of the present invention are provided in series-arms and parallel arms of a ladder arrangement. The filter has four series-arm resonators S1, S2, S3 and S4, and three parallel-arm resonators P1, P2 and P3, these resonators being piezoelectric thin-film resonators having the same fundamental structure as shown in that of the first embodiment of the present invention and having a common device substrate. A Ti film may be provided on the upper electrodes of the parallel-arm resonators in order to reduce the resonant frequencies of the parallel-arm resonators and thus obtain a desired bandpass filter characteristic.

Figure 9:
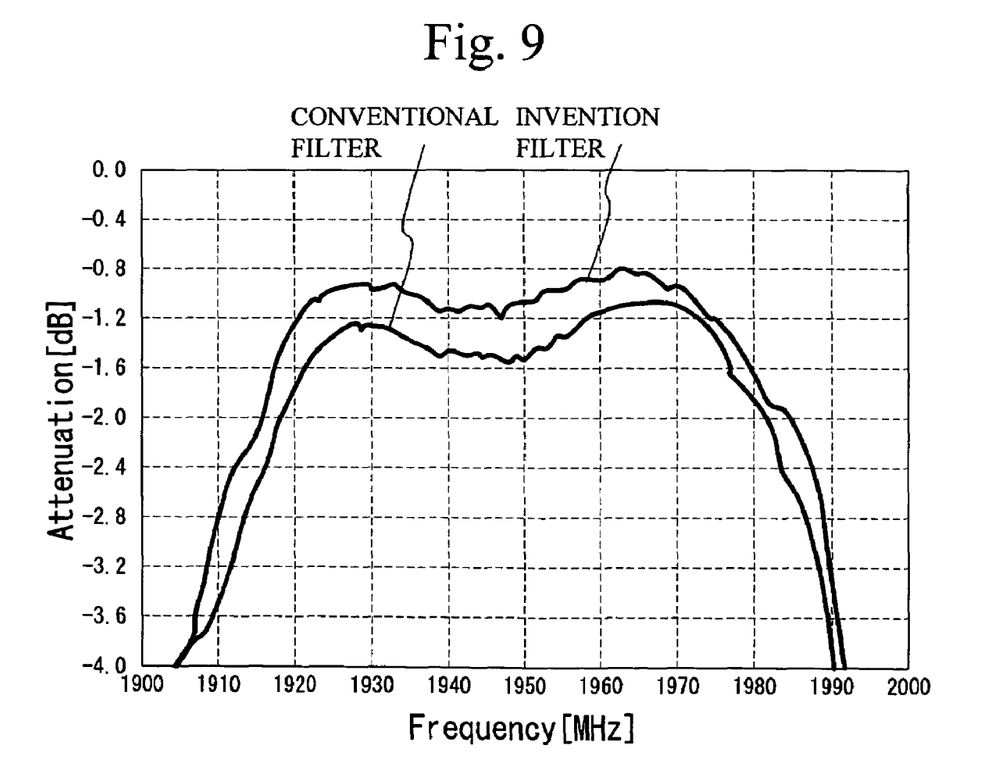
FIG. 9 are graphs of the filter characteristics of the conventional bandpass filter and the bandpass filter in accordance with the second embodiment.

FIG. 9 is a graph of the bandpass characteristic of the above-mentioned bandpass filter. For comparison, FIG. 9 also shows the bandpass characteristic of a conventional bandpass filter with resonators in which the electrode leading portions extending from the membrane have opposing sides that run in parallel from the membrane to the non-membrane. The bandpass filter in accordance with the second embodiment has a reduced insertion loss over the pass band and improved ripples in the pass band due to improvements in the electromechanical coupling coefficient, as compared to the conventional bandpass filter.

The aforementioned embodiments of the present invention are the cavity-type resonators having the cavity between the lower electrode and the substrate. However, similar effects to those obtained in the cavity-type resonators are obtained even for the via-hole type resonators in which the through hole is provided in the device substrate below the lower electrode. The electrodes of the resonators of the present invention may be made of a material that has been described previously.

The present invention is not limited to the specifically described embodiments, and other embodiments and variations may be made without departing from the scope of the present invention.

The present invention is based on Japanese Patent Application Publication No. 2005-005791 filed on Jan. 12, 2005, the entire disclosure of which is hereby incorporated by reference.

What is claimed is:

1. A piezoelectric thin-film resonator comprising:
   a film laminate formed on a device substrate, the film laminate including a lower electrode, a piezoelectric film provided on the device substrate and the lower electrode, and an upper electrode provided on the piezoelectric film,
   at least one of the upper and lower electrodes having an electrode leading portion that extends from an membrane in which the upper electrode overlaps with the lower electrode through the piezoelectric film and has a width narrower than that of the membrane.

2. The piezoelectric thin-film resonator as claimed in claim 1, wherein a cavity is defined between the membrane and the device substrate.

3. The piezoelectric thin-film resonator as claimed in claim 1, wherein:
   the membrane has a raised portion that defines a dome-shaped cavity between the membrane and the device substrate; and
   a projected shape of the cavity on the device substrate has a contour having a closed curve, a polygonal shape, or a combination thereof.

4. The piezoelectric thin-film resonator as claimed in claim 3, wherein the projected shape of the cavity on the device substrate similar to a projected shape of the membrane on the device substrate.

5. The piezoelectric thin-film resonator as claimed in claim 1, wherein the membrane has an oval shape.

6. The piezoelectric thin-film resonator as claimed in claim 1, wherein a projected shape of the cavity on the device substrate and a projected shape of the membrane thereon have polygonal shapes each having at least one pair of sides that are not in parallel.

7. The piezoelectric thin-film resonator as claimed in claim 1, wherein the film laminate has compressive stress.

8. The piezoelectric thin-film resonator as claimed in claim 1, wherein the lower electrode has holes coupled to the cavity between the membrane and the device substrate.

9. The piezoelectric thin-film resonator as claimed in claim 1, wherein the piezoelectric film is an aluminum nitride or zinc oxide film with an orientation having a main axis in a (002) direction.

10. A filter comprising:
    resonators that connected to form a filter and have a device substrate,
    each of the resonators including:
    a film laminate formed on the device substrate, the film laminate including a lower electrode, a piezoelectric film provided on the device substrate and the lower electrode, and an upper electrode provided on the piezoelectric film,
    at least one of the upper and lower electrodes having an electrode leading portion that extends from an membrane in which the upper electrode overlaps with the lower electrode through the piezoelectric film and has a width narrower than that of the membrane.

* * * * *